United States Patent

Lin et al.

[11] Patent Number: 6,127,227
[45] Date of Patent: Oct. 3, 2000

[54] THIN ONO THICKNESS CONTROL AND GRADUAL GATE OXIDATION SUPPRESSION BY $N_2$ TREATMENT IN FLASH MEMORY

[75] Inventors: Chrong Jung Lin, Hsin-Tien; Jong Chen, Taipei; Hung-Der Su, Kao Hsiung; Di-Son Kuo, Hsinchu, all of Taiwan

[73] Assignee: Taiwan Semiconductor Manufacturing Company, Hsin-Chu, Taiwan

[21] Appl. No.: 09/236,491

[22] Filed: Jan. 25, 1999

[51] Int. Cl.[7] .............................................. H01L 21/8247
[52] U.S. Cl. ........................................ 438/261; 438/762
[58] Field of Search .................... 438/257–267, 438/762

[56] References Cited

U.S. PATENT DOCUMENTS

| | | | |
|---|---|---|---|
| 4,996,081 | 2/1991 | Ellul et al. | 427/96 |
| 5,289,026 | 2/1994 | Ong | 257/316 |
| 5,541,436 | 7/1996 | Kwong et al. | 257/410 |
| 5,557,122 | 9/1996 | Shrivastava et al. | 257/309 |
| 5,629,221 | 5/1997 | Chao et al. | 438/591 |
| 5,888,870 | 3/1999 | Gardner et al. | 438/261 |
| 5,966,624 | 10/1999 | Shen | 438/478 |

*Primary Examiner*—Richard Booth
*Attorney, Agent, or Firm*—George O. Saile; Stephen B. Ackerman

[57] ABSTRACT

A method of forming a flash memory cell is disclosed where nitrogen treatment or implantation is employed. Nitrogen introduced into the upper layers of the polysilicon of the floating gate is instrumental in forming an unusually thin layer comprising nitrogen-oxygen-silicon. This N—O—Si layer is formed while growing the bottom oxide layer of the oxide-nitride-oxide, or ONO, the intergate layer between the floating gate and the control gate of the flash memory cell. Nitrogen in the first polysilicon layer provides control for the thickness of the bottom oxide while at the same time suppressing the gradual gate oxidation (GGO) effect in the floating gate. The now augmented ONO composite through the N—O—Si layer provides an enhanced intergate dielectric and hence, a flash memory cell with more precise coupling ratio and better performance.

36 Claims, 3 Drawing Sheets

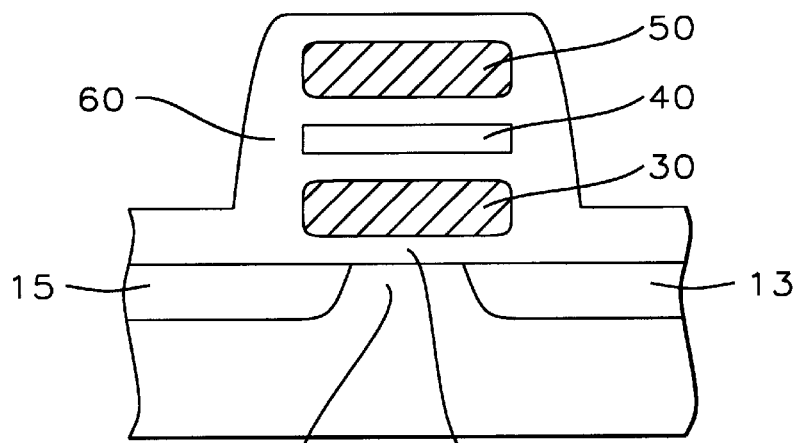
FIG. 1 – Prior Art
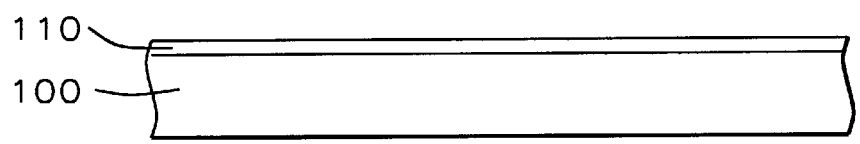
FIG. 2A
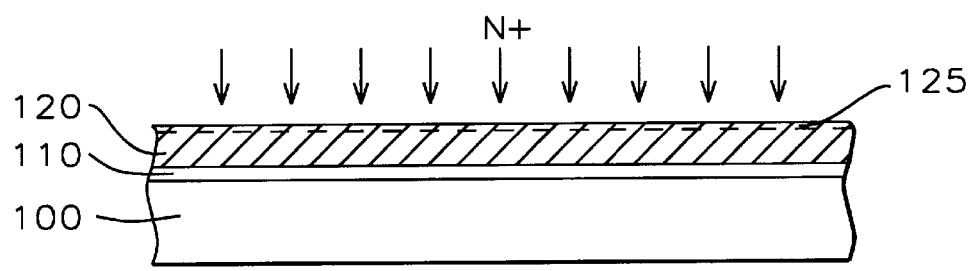
FIG. 2B
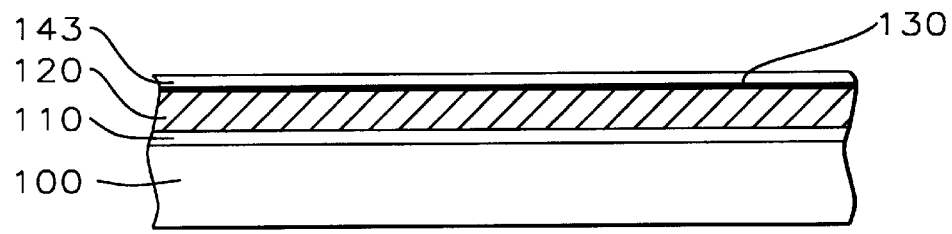
FIG. 2C

THIN ONO THICKNESS CONTROL AND GRADUAL GATE OXIDATION SUPPRESSION BY N₂ TREATMENT IN FLASH MEMORY

BACKGROUND OF THE INVENTION

1. Field of the Invention

The present invention relates to flash EEPROMs (Electrically Erasable Programmable Read Only Memories) in general, and in particular, to a method of suppressing the gradual gate oxidation phenomenon found detrimental in controlling the thickness of intergate ONO thickness which in turn plays an important role in the performance of flash memory devices.

2. Description of the Related Art

Gradual gate oxidation (GGO) effect is observed in oxidizing polygates in flash memory devices. It is found that GGO effect can produce problems associated with coupling ratio influenced by both the overlap of the floating gate over the source and drain regions, and by the thickness of the silicon dioxide grown between the floating gate and the control gate. The oxidation of the gate and the rate of growth of the oxide can be controlled by ion implantation. For example, nitrogen ions implanted within a semiconductor substrate will retard the oxidation rate of the substrate while fluorine ions will advance the oxidation rate of the substrate. In this invention, use of nitrogen in polysilicon (poly-Si) floating gate is disclosed to decrease poly-Si growth rate so that a thin layer of oxide can be formed. The quality and thickness of silicon dioxide grown on polysilicon can play an important role in the reliability and performance of a memory device. Two particular types of devices where this type of oxide plays a critical role are dynamic random access memory (DRAM) cells and nonvolatile memory devices employing floating gates.

Among the nonvolatile read only memories, such as masked-ROMs, Electrically Programmable (EP-ROMs), EEPROMs have been known as one type of nonvolatile memory semiconductor devices capable of electrically writing and erasing information. However, EEPROMs require two transistors to operate. In Flash EEPROM, the memory cell includes one transistor, and the contents of all the memory's cells can be erased simultaneously through the use of an electrical erase signal. Hence, with Flash memory, in addition to gaining speed in having the cells erased much more rapidly, higher levels of integration can be achieved with fewer devices. Furthermore, unlike EEPROMs which use Fowler-Nordheim (F/N) tunneling for programming an erasing a floating gate, Flash EEPROMs use hot-electron injection to program and F/N tunneling for erase.

A typical one transistor Flash EEPROM cell is shown in FIG. 1 including a substrate (10) having a source region (13) and a drain region (15) separated by a channel (17). A tunnel oxide (20) insulates substrate (10) from floating gate (30), which in turn is insulated from control gate (50) by intergate oxide (40). The one transistor cell is formed by first growing or depositing tunnel oxide (20) over a substrate (10). A first polysilicon layer is next deposited over the tunnel oxide (20) to form a floating gate layer. The conductivity of the floating gate layer can be increased by in-situ doping or ion implantation. The intergate dielectric (40) is then formed on top of the floating gate (30). The intergate dielectric is typically a three layer dielectric of silicon dioxide, silicon nitride, and silicon dioxide, and is known as ONO. It is common to form the first layer of ONO by oxidizing the polysilicon floating gate layer. A control gate layer is formed by depositing a second polysilicon layer over the intergate dielectric and doping it as needed. The three layers (floating gate, intergate dielectric, and control gate) are then patterned to form a gate stack as shown in FIG. 1. Subsequently, the gate stack so formed is subjected to an oxidation step to form oxide walls (60) as shown in the same FIG. 1.

In operation, source (15) is grounded, and a positive voltage is applied to control gate (50) with respect to drain (13) to perform programming. Electrons are injected into floating gate (30) resulting in an overall higher memory cell threshold voltage. To perform erase, a positive voltage is applied to source (15) with respect to control gate (50), and electrons tunnel from floating gate (30) to source (15).

Despite the advantages of flash EEPROM technology, a number of reliability issues exist in prior art as discussed by Shrivastava, et al, in U.S. Pat. No. 5,557,122. Shrivastava, et al., propose gates having improved grain structure and oxide growth properties so as to alleviate the problem of over-erasure of memory cells in EEPROMs as well as to improve data retention in DRAMs. The over-erasure problem arises because, in flash EEPROM a number of memory cells share a common source node allowing for the simultaneous (flash) erase of the entire memory array or a portion thereof. In the event a cell possesses an erase (tunneling) current greater than the other cells in the array (or portion thereof), during a given erase operation the cell having the higher erase current will be over-erased while the other cells are properly erased. Over-erasure results in unacceptably low cell threshold voltage. Similarly, leakage paths can occur from the floating gate to the control gate through defects in the intergate dielectric, or through the tunnel oxide to the substrate as well, resulting again in unacceptably low cell threshold voltage to the extent that the voltage in programmed cells becomes indistinguishable from that in erased cells. Thus, it is important that the integrity of the intergate dielectric is achieved in order to alleviate reliability problems. Shrivastava, et al., approach this problem by using amorphous silicon rather than polycrystalline silicon as a floating gate material and then doping the amorphous silicon with nitrogen. According to Shrivastava, et al., the intergate silicon oxide grown from the amorphous silicon gate has fewer stress induced defects reducing leakage paths that contribute to unacceptable voltage threshold levels, and hence improving reliability.

Kwong, et al., also disclose in U.S. Pat. No. 5,541,436 an improved oxynitride dielectric having nitrogen atoms therein with a profile having a peak at the silicon oxide-silicon interface formed by oxidizing a surface of a monocrystalline silicon body in an atmosphere of nitrous oxide ($N_2O$) at a temperature in the range of 900 to 1100° C., and then heating the silicon body and oxidized surface in an atmosphere of anhydrous ammonia to introduce additional nitrogen atoms into the oxide and increase resistance to boron penetration without degrading the oxide by charge trapping. Chao, et al., also propose a method of suppressing boron penetration in polysilicon gate using inductively coupled nitrogen plasma in U.S. Pat. No. 5,629,221.

Ellul, in U.S. Pat. No. 4,996,081, on the other hand, disclose a method of forming multiple nitride coating on silicon. Here, a composite dielectric layer is formed on a monocrystalline, polycrystalline or amorphous silicon substrate by thermally growing a first silicon nitride layer from a surface layer of the silicon and then depositing a layer of amorphous of polycrystalline silicon. A second nitride layer is thermally grown from the deposited silicon to form a nitride-silicon-nitride composite dielectric.

Also, Ong discloses in U.S. Pat. No. 5,289,026 an electrically erasable non-volatile EPROM memory device having an asymmetric floating gate with respect to a buried source region and a buried drain region. This enables an increase in the potential across the tunnel oxide layer during erasing thereby reducing the erase time of the device.

Generally, related art uses nitrogen doped amorphous silicon as floating gate in an attempt to improve the forming of the intergate oxide between the floating gate and the control gate of EEPROM cells. This invention discloses a method of improving the characteristics of the intergate dielectric grown from nitrogen doped polycrystalline silicon floating gate. It is shown that when grown from nitrogen doped polysilicon, there results an unusually thin layer comprising N—O—Si which has an important controlling effect on the thickness of the bottom oxide of an augmented ONO composite which in turn enhances the performance of a flash memory through a better control on the coupling ratio of the cell.

SUMMARY OF THE INVENTION

It is therefore an object of this invention to provide a method of forming a well-defined and thin intergate ONO thickness in a flash memory cell.

It is another object of this invention to provide a method of suppressing gradual gate oxidation effect in a flash memory cell.

It is yet another object of this invention to provide a method of performing nitrogen treatment, or nitrogen implantation of the floating gate of a flash memory cell in order to suppress gradual gate oxidation effect between the floating gate and the control gate as well as to improve the coupling ratio of the memory cell.

These objects are accomplished by providing a semiconductor substrate; forming a tunnel oxide layer over said substrate; forming a first polysilicon layer over said tunnel oxide layer; performing $N_2$ treatment of said first polysilicon layer to form a layer of impurity in said polysilicon layer; forming a tri-layer ONO composite over said first polysilicon layer further comprising a bottom oxide layer, a middle nitride layer and a top oxide layer; forming a second polysilicon layer over said tri-layer ONO composite; patterning said second polysilicon layer, said ONO layer, and said first polysilicon layer to form a stacked gate; and forming thick sidewall oxide on the sidewalls of said stacked gate of said flash memory cell.

In another embodiment, these objects are further accomplished by performing nitrogen implantation on the floating gate of the flash memory cell.

BRIEF DESCRIPTION OF THE DRAWINGS

FIG. 1 is a partial cross-sectional view of a flash memory cell of prior art.

FIG. 2a is a partial cross-sectional view of a semiconductor substrate showing the forming of a tunnel oxide layer thereon according to the present invention.

FIG. 2b is a partial cross-sectional view of a semiconductor substrate showing the introduction of nitrogen into the first polysilicon layer formed over the tunnel oxide of FIG. 2a, according to this invention.

FIG. 2c is a partial cross-sectional view of a semiconductor substrate showing the main feature of forming of a very thin layer of N—O—Si while at the same time forming the bottom oxide of the augmented ONO composite of this invention.

DESCRIPTION OF THE PREFERRED EMBODIMENTS

Figure 2D:
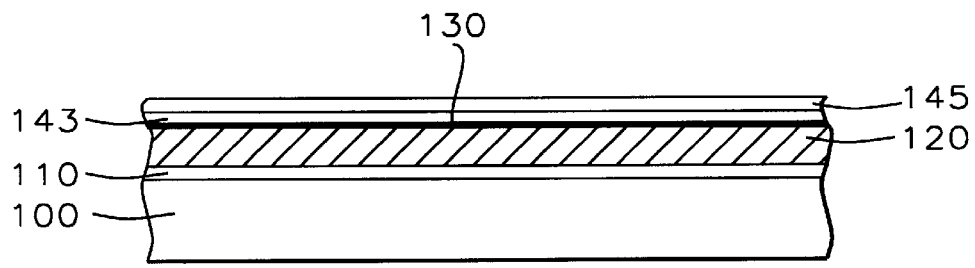
FIG. 2d is a partial cross-sectional view of a semiconductor substrate showing the step of forming the middle nitride layer of the augmented ONO composite of this invention.
Figure 2E:
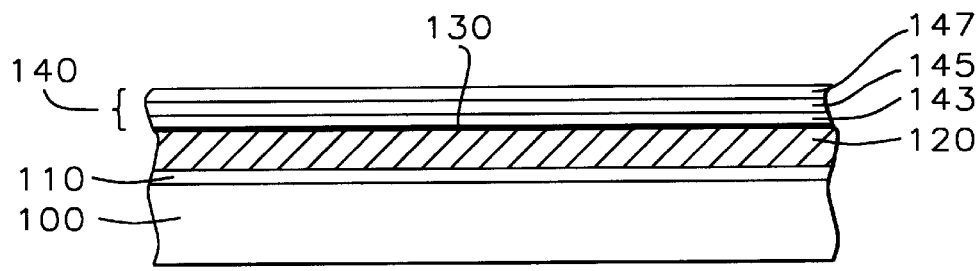
FIG. 2e is a partial cross-sectional view of a semiconductor substrate showing the step of forming the top oxide layer of the augmented ONO composite of this invention.

Referring now to the drawings, in particular to FIGS. 2a–2h, there are shown schematically steps of forming a flash memory cell having nitrogen treated or implanted floating gate and therefore, suppressed gate oxidation on the floating gate so as to improve coupling ratio through better controlled ONO intergate thickness.

In FIG. 2a, substrate (100), preferably silicon, is provided with tunnel oxide (110). It is preferred that the tunnel oxide is thermally grown at a temperature between about 700 to 950° C., and that it has a thickness between about 80 to 150 angstroms (Å).

A first polysilicon layer (120) is next formed over tunnel oxide layer (110) through methods including but not limited to Low Pressure Chemical Vapor Deposition (LPCVD) methods, Chemical Vapor Deposition (CVD) methods and Physical Vapor Deposition (PVD) sputtering methods employing suitable silicon source materials, preferably formed through an LPCVD method employing silane $SiH_4$ as a silicon source material at a temperature range between about 550 to 650° C. The preferred thickness is between about 1000 to 2500 angstroms (Å).

As a main feature and key aspect of this invention, the polysilicon layer is then subjected to nitrogen treatment as shown in FIG. 2b. The nitrogen treatment is accomplished at a pressure between about 400 to 600 millitorr (mT). In a second embodiment, the first polysilicon layer is subjected to ion implantation at a dosage level between about $1 \times 10^{12}$ to $5 \times 10^{14}$ atoms/cm$^2$ at an energy between about 5 to 30 KeV. It will be appreciated that the presence of nitrogen, shown as phantom dots (125) in FIG. 2b, in the upper layers of polysilicon (120) will suppress the oxidation rate of polysilicon, thereby providing an enhanced control of the thickness of the bottom oxide of the ONO composite that is to be formed next over the first polysilicon layer. In essence, the thickness of the bottom oxide of the ONO layer to be formed is controlled by still another very thin layer formed through the combination of the nitrogen introduced into the first polysilicon layer with silicon and the oxidizing oxygen of the next step. This additional thin layer thus forms an augmented ONO layer.

Thus, the bottom oxide layer (143) in FIG. 2c, of the to be augmented ONO layer, is next formed by first subjecting the nitrogen rich first polysilicon layer to oxidation, preferably at a temperature between about 700 to 1050° C. However, at the same that the bottom oxide layer is grown, still another, but an unusually thin augmented layer (130) is formed having a composition of nitrogen, oxygen and silicon (N—O—Si). The thickness of the N—O—Si layer is only between about 5 to 10 Å, while the overlying bottom oxide assumes a thickness of between about 40 and 120 Å.

It will be apparent to those skilled in the art that the unusual thinness of the augmented layer (130) along with the thin and uniform thickness of the bottom oxide layer (143) of the augmented ONO then makes it possible to attain the precise coupling ratio that is required for the accurate performance of the memory cell. Also, while nitrogen in the first polysilicon slows down the polysilicon oxide growth for thin augmented ONO formation, it suppresses the gradual gate oxidation (GGO) effect in the floating gate. This in turn is found to increase gate coupling ratio as well as improving charge retention of the cell.

Subsequently, a middle layer of nitride, (133) in FIG. 2d, is formed over the bottom oxide layer, preferably by reacting dichlorosilane ($SiCl_2H_2$) with ammonia ($NH_3$) in an LPCVD at a pressure between about 0.3 to 0.6 torr, temperature between about 550 to 650° C. to a thickness between about 60 to 120 Å. This is followed by forming the top oxide layer (135) of the augmented ONO composite (140) shown in FIG. 2e by employing low pressure chemical vapor deposition (LPCVD). The preferred thickness of the top oxide layer is between about 20 to 80 Å.

The oxide-nitride-oxide, or the augmented ONO layer (140) so formed becomes the intergate dielectric between the floating gate of the first polysilicon layer and the control gate of the second polysilicon layer to be formed. As in the case with the first polysilicon layer, a second polysilicon layer (150) is formed over the augmented ONO composite through methods including but not limited to Low Pressure Chemical Vapor Deposition (LPCVD) methods, Chemical Vapor Deposition (CVD) methods and Physical Vapor Deposition (PVD) sputtering methods employing suitable silicon source materials, preferably formed through an LPCVD method employing silane $SiH_4$ as a silicon source material at a temperature range between about 550 to 650° C. The preferred thickness of the second polysilicon layer (150) is between about 1000 to 3000 angstroms (Å).

Figure 2F:
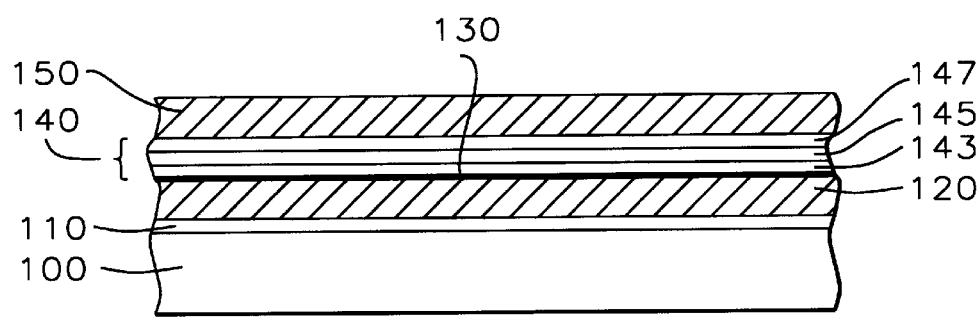
FIG. 2f is a partial cross-sectional view of a semiconductor substrate showing the step of forming the second polysilicon over the augmented ONO composite of this invention.
Figure 2G:
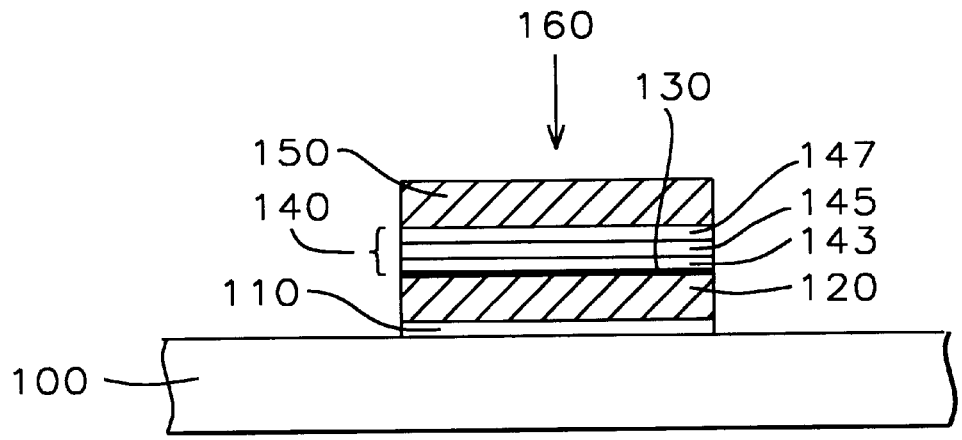
FIG. 2g is a partial cross-sectional view of a semiconductor substrate showing the step of forming the stacked gate of this invention.
Figure 2H:
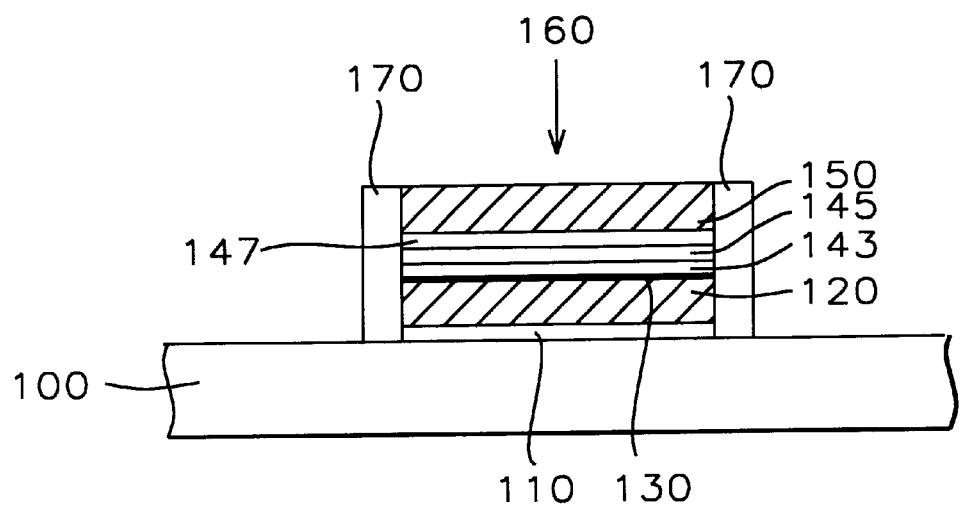
FIG. 2h is a partial cross-sectional view of a semiconductor substrate showing the step of forming the thick oxide spacers of the stacked gate of this invention.

The resulting structure of FIG. 2f, comprising tunnel oxide (110), first polysilicon layer (120), augmented ONO composite (140) including the N—O—Si layer, and second polysilicon layer (150) are then patterned and etched to form the stacked gate (160) of FIGS. 2g and 2h. It is preferred that the patterning is accomplished in a carrier gas argon (Ar) by using anisotropic plasma etching with an etchant gas chlorine ($Cl_2$) in the case with nitrogen treated first polysilicon layer and hydrogen bromide (HBr) in the case where nitrogen implantation of the first polysilicon is performed. The fabrication of the stacked memory cell of FIG. 2g is completed by forming oxide spacers (170) on the side-walls of the stacked gate as shown in FIG. 2h. The forming of the thick spacers (170) is accomplished by depositing and anisotropically etching an oxide layer (not shown) and they have a thickness between about 1000 to 2000 Å.

A method of forming a flash memory cell has been disclosed where nitrogen treatment or implantation is employed. Nitrogen introduced into the upper layers of the polysilicon of the floating gate is instrumental in forming an unusually thin layer comprising nitrogen-oxygen-silicon. This N—O—Si layer is formed while growing the bottom oxide layer of the oxide-nitride-oxide, or ONO, the intergate layer between the floating gate and the control gate of the flash memory cell. Nitrogen in the first polysilicon layer provides control for the thickness of the bottom oxide while at the same time suppressing the gradual gate oxidation (GGO) effect. The now augmented ONO composite through the N—O—Si layer provides an enhanced intergate dielectric and hence, a flash memory cell with more precise coupling ratio and better performance.

While the invention has been particularly shown and described with reference to the preferred embodiments thereof, it will be understood by those skilled in the art that various changes in form and details may be made without departing from the spirit and scope of the invention.

What is claimed is:

1. A method of gradual gate oxidation suppression by $N_2$ treatment in a flash memory cell comprising the steps of:

providing a semiconductor substrate;

forming a tunnel oxide layer over said substrate;

forming a first polysilicon layer over said tunnel oxide layer;

performing $N_2$ treatment of said first polysilicon layer to form a layer of impurity in said polysilicon layer;

forming an augmented ONO composite over said first polysilicon layer further comprising an thin N—O—Si layer, a bottom oxide layer, a middle nitride layer and a top oxide layer, whereby the thin N—O—Si layer is formed by thermal oxidation and the impurity in said polysilicon layer suppresses the oxidation;

forming a second polysilicon layer over said augmented ONO composite;

patterning said second polysilicon layer, said ONO layer, and said first polysilicon layer to form a stacked gate; and forming thick sidewall oxide on the sidewalls of said stacked gate of said flash memory cell.

2. The method of claim 1, wherein said semiconductor substrate is silicon.

3. The method of claim 1, wherein said tunnel oxide is thermally grown at a temperature between about 700 to 950° C.

4. The method of claim 1, wherein said tunnel oxide has a thickness between about 80 to 150 angstroms (Å).

5. The method of claim 1, wherein said first polysilicon layer is formed through an LPCVD method employing silane $SiH_4$ as a silicon source material at a temperature range between about 550 to 650° C. to form a floating gate.

6. The method of claim 1, wherein said first polysilicon layer has a thickness between about 1000 to 2500 Å.

7. The method of claim 1, wherein said performing said $N_2$ treatment of said first polysilicon layer is accomplished with nitrogen gas at a pressure between about 400 to 600 mT.

8. The method of claim 1, wherein said N—O—Si layer has a thickness between about 5 to 10 Å.

9. The method of claim 1, wherein said bottom oxide layer of said augmented ONO composite has a thickness between about 40 to 120 Å.

10. The method of claim 1, wherein said middle nitride layer of said augmented ONO composite is formed by reacting dichlorosilane ($SiCl_2H_2$) with ammonia ($NH_3$) in an LPCVD at a pressure between about 0.3 to 0.6 torr, temperature between about 550 to 650° C.

11. The method of claim 1, wherein said middle nitride layer of said augmented ONO composite has a thickness between about 60 to 120 Å.

12. The method of claim 1, wherein said top oxide layer of said augmented ONO composite is an LPCVD oxide.

13. The method of claim 1, wherein said top oxide layer of said augmented ONO composite has a thickness between about 20 to 80 Å.

14. The method of claim 1, wherein said second polysilicon layer is formed through an LPCVD method employing silane $SiH_4$ as a silicon source material at a temperature range between about 550 to 650° C. to form a control gate.

15. The method of claim 1, wherein said second polysilicon layer has a thickness between about 1000 to 3000 Å.

16. The method of claim 1, wherein said patterning said stacked gate is accomplished by using anisotropic plasma etching with an etchant gas chlorine ($Cl_2$) and a carrier gas argon (Ar).

17. The method of claim 1, wherein said forming said thick sidewall oxide on the sidewalls of said stacked gate is accomplished by depositing and anisotropically etching an oxide layer.

18. The method of claim 17, wherein thickness of said thick sidewall is between about 1000 to 2000 Å.

19. A method of gradual gate oxidation suppression by $N_2$ implantation in a flash memory cell comprising the steps of:

provi a semiconductor substrate;

forming a tunnel oxide layer over said substrate;

forming a first polysilicon layer over said tunnel oxide layer;

performing ion implantation on said first polysilicon layer to form a layer of impurity in said polysilicon layer;

forming an augmented ONO composite over said first polysilicon layer further comprising an thin N—O—Si layer, a bottom oxide layer, a middle nitride layer and a top oxide layer, whereby the thin N—O—Si layer is formed by thermal oxidation and the impurity in said polysilicon layer suppresses the oxidation;

forming a second polysilicon layer over said augmented ONO composite;

patterning said second polysilicon layer, said ONO layer, and said first polysilicon layer to form a stacked gate; and forming thick sidewall oxide on the sidewalls of said stacked gate of said flash memory cell.

20. The method of claim 19, wherein said semiconductor substrate is silicon.

21. The method of claim 19, wherein said tunnel oxide is thermally grown at a temperature between about 700 to 950° C.

22. The method of claim 19, wherein said tunnel oxide has a thickness between about 80 to 150 angstroms (Å).

23. The method of claim 19, wherein said first polysilicon layer is formed through a LPCVD method employing silane $SiH_4$ as a silicon source material at a temperature range between about 550 to 650° C. to form a floating gate.

24. The method of claim 19, wherein said first polysilicon layer has a thickness between about 1000 to 2500 Å.

25. The method of claim 19, wherein said performing ion implantation on said first polysilicon layer is accomplished by implanting nitrogen ions at a dosage level between about $1\times10^{12}$ to $5\times10^{14}$ atoms/cm$^2$ and energy level between about 5 to 30 KeV.

26. The method of claim 19, wherein said N—O—Si layer has a thickness between about 5 to 10 Å.

27. The method of claim 19, wherein said bottom oxide layer of said augmented ONO composite has a thickness between about 40 to 120 Å.

28. The method of claim 19, wherein said middle nitride layer of said augmented ONO composite is formed by reacting dichlorosilane ($SiCl_2H_2$) with ammonia ($NH_3$) in an LPCVD at a pressure between about 0.3 to 0.6 torr, temperature between about 550 to 650° C.

29. The method of claim 19, wherein said middle nitride layer of said augmented ONO composite has a thickness between about 60 to 120 Å.

30. The method of claim 19, wherein said top oxide layer of said augmented ONO composite is an LPCVD oxide.

31. The method of claim 19, wherein said top oxide layer of said augmented ONO composite has a thickness between about 20 to 80 Å.

32. The method of claim 19, wherein said second polysilicon layer is formed through an LPCVD method employing silane $SiH_4$ as a silicon source material at a temperature range between about 550 to 650° C. to form a control gate.

33. The method of claim 19, wherein said second polysilicon layer has a thickness between about 1000 to 3000 Å.

34. The method of claim 19, wherein said patterning said stacked gate is accomplished by using anisotropic plasma etching with an etchant gas hydrogen bromide (HBr), and a carrier gas argon (Ar).

35. The method of claim 19, wherein said forming said thick sidewall oxide on the sidewalls of said stacked gate is accomplished by depositing and anisotropically etching an oxide layer.

36. The method of claim 35, wherein thickness of said thick sidewall is between about 1000 to 2000 Å.

\* \* \* \* \*